(12) United States Patent
Jang et al.

(10) Patent No.: US 9,466,505 B2
(45) Date of Patent: Oct. 11, 2016

(54) METHODS OF PATTERNING FEATURES HAVING DIFFERING WIDTHS

(71) Applicants: GLOBALFOUNDRIES Inc., Grand Cayman, KY (US); International Business Machines Corporation, Armonk, NY (US)

(72) Inventors: Linus Jang, Clifton Park, NY (US); Soon-Cheon Seo, Glenmont, NY (US); Ryan O. Jung, Rensselaer, NY (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/935,767

(22) Filed: Nov. 9, 2015

(65) Prior Publication Data

US 2016/0064236 A1 Mar. 3, 2016

Related U.S. Application Data

(62) Division of application No. 13/874,577, filed on May 1, 2013, now Pat. No. 9,214,360.

(51) Int. Cl.
| | |
|---|---|
| *H01L 21/311* | (2006.01) |
| *H01L 21/308* | (2006.01) |
| *H01L 21/033* | (2006.01) |
| *H01L 21/3213* | (2006.01) |
| *H01L 21/28* | (2006.01) |
| *H01L 21/8238* | (2006.01) |
| *H01L 21/283* | (2006.01) |
| *H01L 29/66* | (2006.01) |

(52) U.S. Cl.
CPC ....... *H01L 21/3085* (2013.01); *H01L 21/0337* (2013.01); *H01L 21/283* (2013.01); *H01L 21/28141* (2013.01); *H01L 21/3081* (2013.01); *H01L 21/32139* (2013.01); *H01L 21/82385* (2013.01); *H01L 29/6656* (2013.01)

(58) Field of Classification Search
CPC .................. H01L 21/28141; H01L 21/82385; H01L 21/32139; H01L 21/0337; H01L 21/311
See application file for complete search history.

(56) References Cited

U.S. PATENT DOCUMENTS

| | | |
|---|---|---|
| 2006/0068596 A1 | 3/2006 | Dobuzinsky et al. |
| 2012/0043646 A1 | 2/2012 | Kim |

*Primary Examiner* — Asok K Sarkar
*Assistant Examiner* — Dmitriy Yemelyanov
(74) *Attorney, Agent, or Firm* — Amerson Law Firm, PLLC

(57) ABSTRACT

A method includes forming a layer of material above a semiconductor substrate and performing a first sidewall image transfer process to form a first plurality of spacers and a second plurality of spacers above the layer of material, wherein the first and second pluralities of spacers are positioned above respective first and second regions of the semiconductor substrate and have a same initial width and a same pitch spacing. A masking layer is formed above the layer of material so as to cover the first plurality of spacers and expose the second plurality of spacers, and a first etching process is performed through the masking layer on the exposed second plurality of spacers so as to form a plurality of reduced-width spacers having a width that is less than the initial width, wherein the first plurality of spacers and the plurality of reduced-width spacers define an etch mask.

18 Claims, 12 Drawing Sheets

METHODS OF PATTERNING FEATURES HAVING DIFFERING WIDTHS

BACKGROUND

1. Field of the Disclosure

Generally, the present disclosure relates to the manufacture of semiconductor devices, and, more specifically, to various methods of patterning features that have differing widths.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Numerous processing operations are performed in a very detailed sequence, or process flow, to form integrated circuit devices, e.g., deposition processes, etching processes, heating processes, masking operations, etc. In general, the formation of integrated circuit devices involves, among other things, the formation of various layers of material and patterning or removing portions of those layers of material to define a desired structure, such as a gate electrode, a sidewall spacer, etc. Device designers have been very successful in improving the electrical performance capabilities of transistor devices, primarily by reducing the size of or "scaling" various components of the transistor, such as the gate length of the transistors. In fact, device dimensions on modern day transistors have been reduced to the point where direct patterning of such features is very difficult using existing 193 nm based photolithography tools and technology. Thus, device designers have employed various techniques to pattern very small features. One such technique is generally known as a sidewall image transfer technique.

Device designers are under constant pressure to increase the operating speed and electrical performance of transistors and integrated circuit products that employ such transistors. Device designers are also under constant pressure to reduce the power consumed by an integrated circuit device during operation. This is particularly true for integrated circuit products that are intended for mobile applications, such as cell phones, laptop computers, etc. In general, all other things being equal, the smaller the gate length of a transistor, the faster will be its operating or switching speed. This increase in operating speed is not without "costs," as, in general, devices with smaller gate lengths exhibit increased leakage current when the transistor device is in the "off" state, which results in relatively more power consumption for the smaller gate length devices.

Thus, in some applications, device designers design chips comprised of transistors having different gate lengths formed on the same semiconductor substrate. For example, in the logic circuits of an integrated circuit product where switching speed and high performance is paramount, an integrated circuit product may be designed so as to only use high-performance, relatively smaller gate length transistor devices in such logic circuits. However, in other regions of the integrated circuit product where switching speed is not as critical, e.g., input/output circuits, the product may be designed so as to use transistor devices having relatively larger gate lengths in an effort to reduce the overall power consumption of the integrated circuit product.

Figure 1A:
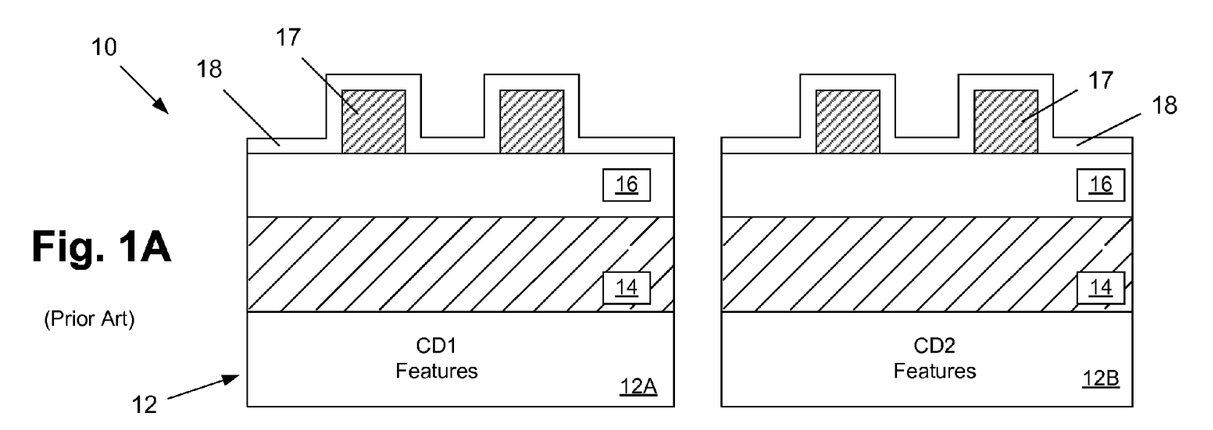
FIGS. 1A-1F depict one illustrative prior art technique of forming features having different widths using an additive sidewall image transfer technique.

Manufacturing features, such as gate structures, that have different critical dimensions or widths, e.g., different gate lengths, on the same semiconductor chip is not without its problems. FIGS. 1A-1F depict one illustrative prior art technique of forming features having different widths using a sidewall image transfer technique. This technique may generally be referred to as an "additive" sidewall image transfer technique. FIG. 1A depicts a prior art device 10 and regions 12A, 12B of the same semiconductor substrate 12. As indicated, features having a first critical dimension ("CD1 Features") will be formed above the region 12A while features having a second critical dimension ("CD2 Features"), that is different than the critical dimension of the CD1 Features, will be formed above the region 12B.

At the point of manufacture depicted in FIG. 1A, a layer of material 14 to be patterned, e.g., a layer of gate electrode material, and a hard mask material 16 have been formed above the substrate 12. Also depicted in FIG. 1A are a plurality of so-called mandrel structures 17 and a layer of spacer material 18 that has been deposited across the substrate 12 by performing a conformal deposition process. In one illustrative example, the layer of material 14 may be a layer of polysilicon, the hard mask material 16 may be a layer of silicon nitride, the mandrels 17 may be comprised of a material that may be selectively etched relative to the hard mask material 16, such as an amorphous silicon material, and the layer of spacer material 18 may be a layer of silicon dioxide. The mandrels 17 may be formed by depositing a layer of mandrel material and thereafter patterning the layer of mandrel material using known photolithography tools and techniques. The width of the mandrels 17 and the thickness of the layer of spacer material 18 may vary depending upon the particular application.

Figure 1B:
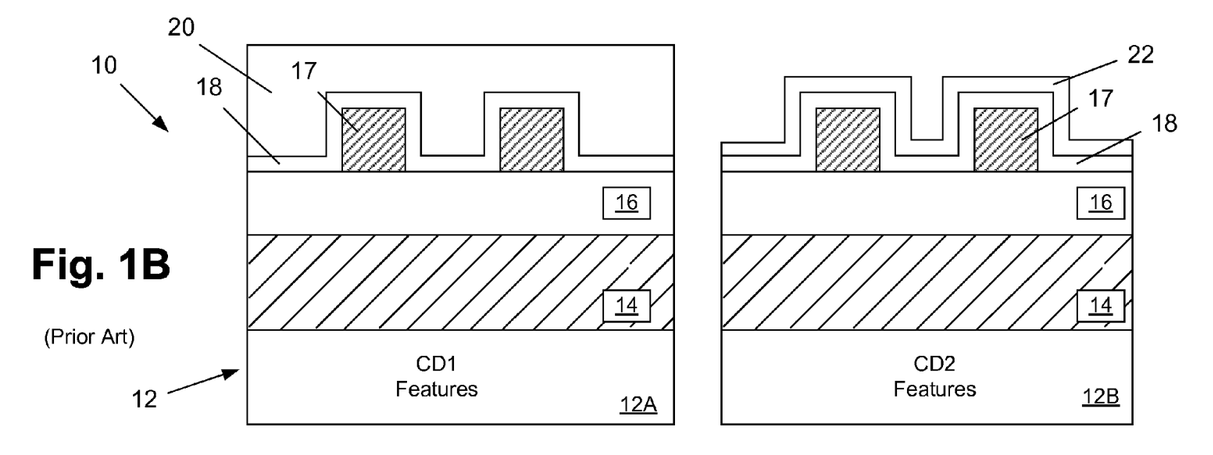

FIG. 1B depicts the device 10 after several process operations have been performed. First, a masking layer 20, such as a patterned photoresist mask, has been formed above the substrate 12 such that it covers the region 12A but leaves the region 12B exposed for further processing. Thereafter, a second layer spacer material 22 has been formed above the first layer of spacer material 18 but only in the region 12B where the CD2 Features will be formed. The layer of spacer material 22 was deposited by performing a conformal deposition process and it may be comprised of the same material as that of the layer of spacer material 18. The thickness of the layer of spacer material 22 may vary depending upon the particular application.

Figure 1C:
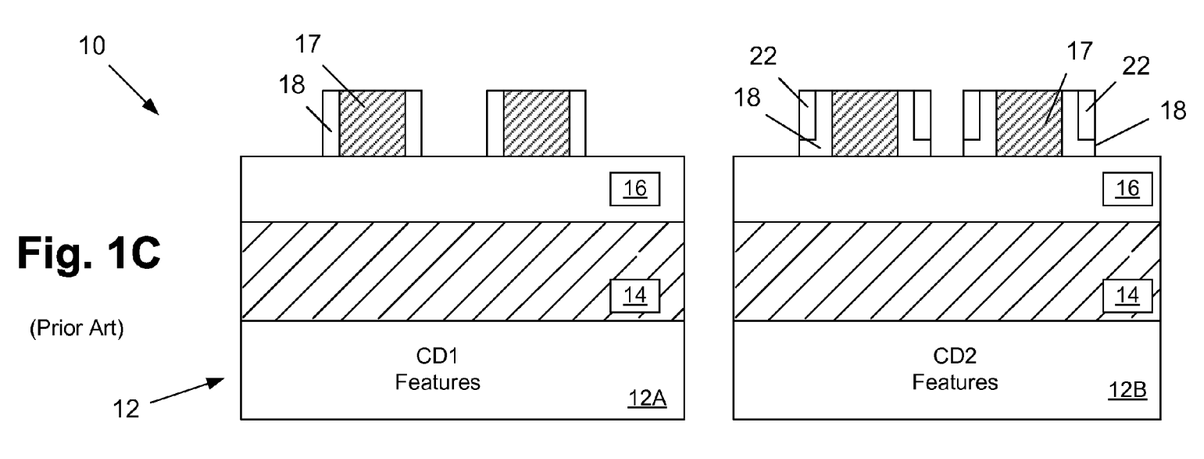

FIG. 1C depicts the device 10 after several process operations have been performed. First, the masking layer 20 was removed, thereby exposing both of the regions 12A, 12B for further processing. Second, an anisotropic etching process was performed to define spacers 18 adjacent the mandrels 17 above the first region 12A and the combination spacer 18/22 adjacent the mandrels 17 above the second region 12B.

Figure 1D:
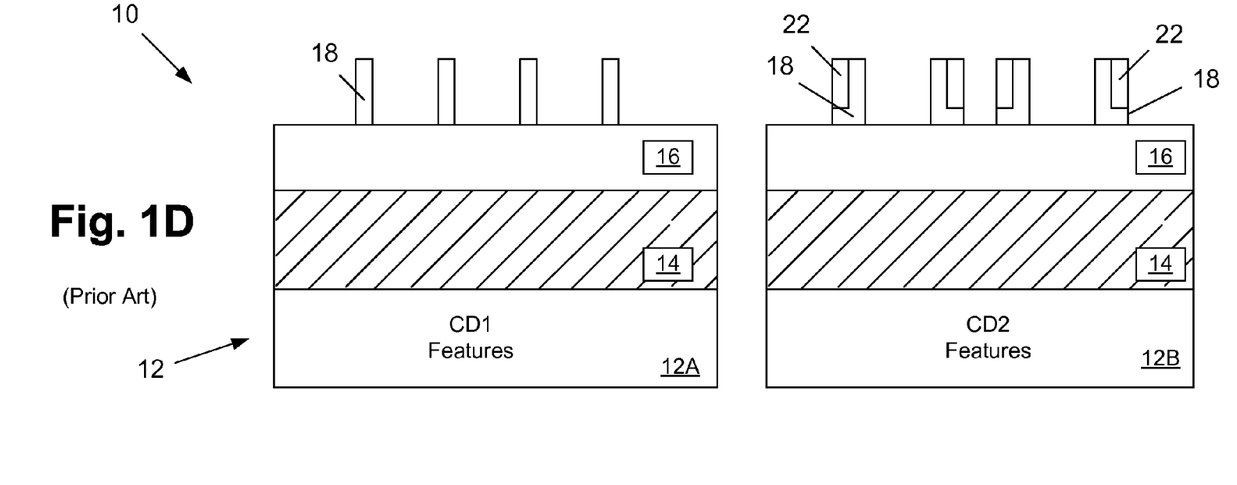

Then, as shown in FIG. 1D, the mandrels 17 were removed by performing a selective etching process that leaves the spacers 18 and the combination spacers 18/22 to act as masks in a subsequent etching process that defines features in the hard mask material 16, i.e., to create a patterned hard mask layer that will be used in defining various features in the layer of material 14.

Figure 1E:
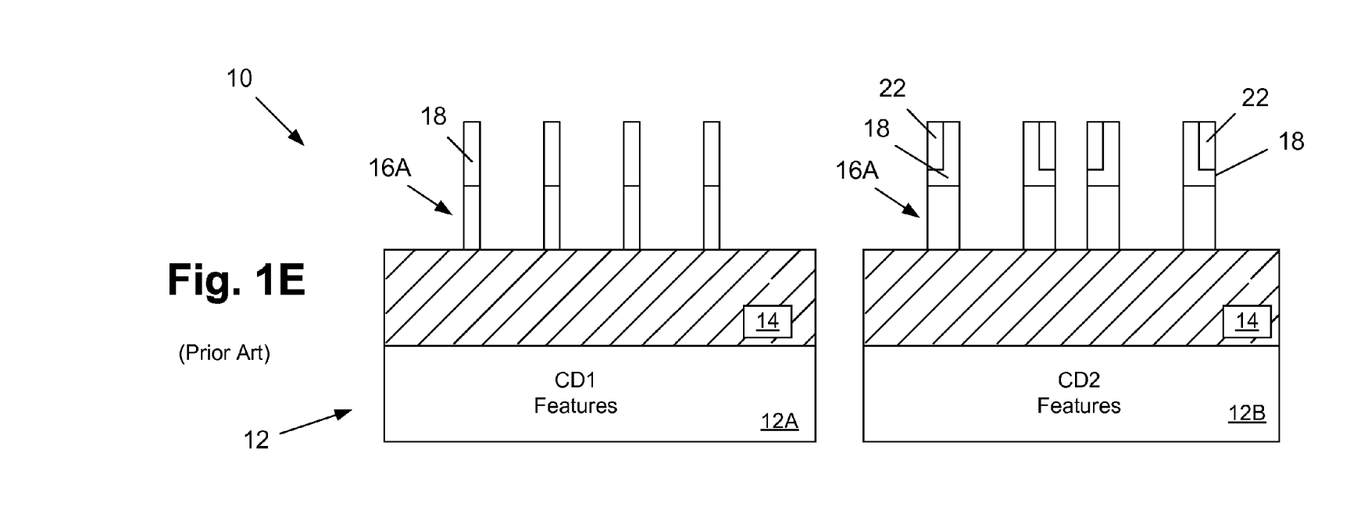

Next, as shown in FIG. 1E, an anisotropic etching process was performed on the hard mask material 16 through the mask layer comprised of the spacers 18 and the spacer combination 18/22 to thereby define a patterned hard mask layer 16A that will be used in defining various features in the layer of material 14.

Figure 1F:
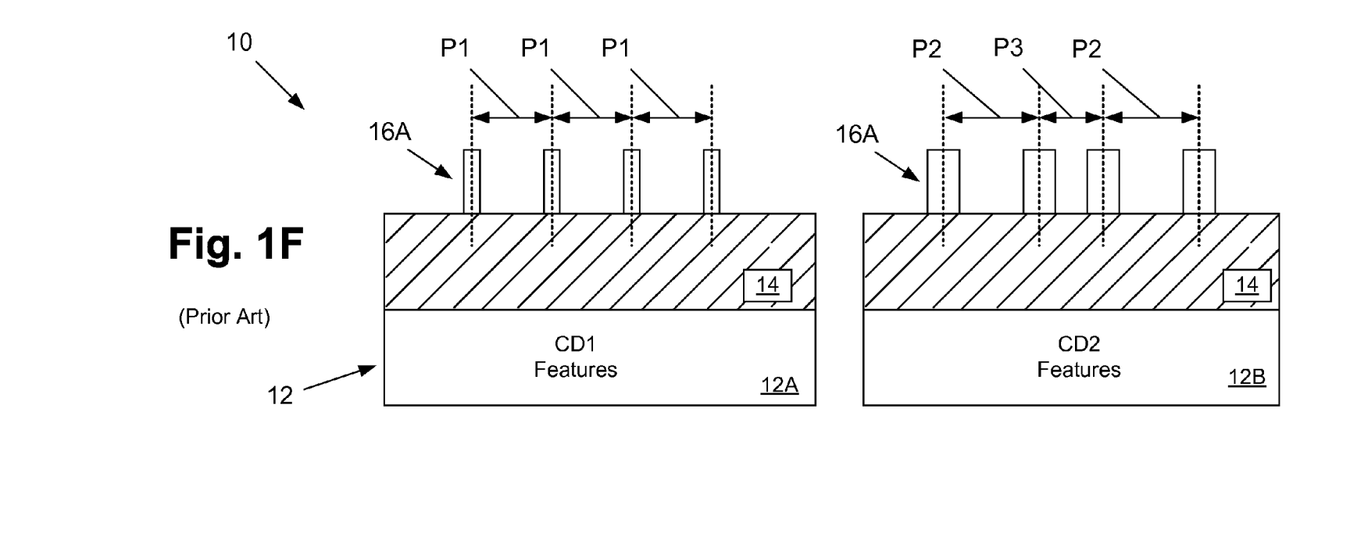

FIG. 1F depicts the device 10 after the spacers 18 and the combination spacers 18/22 have been removed. Note that the features of the patterned hard mask layer 16A positioned above the first region 12A have a uniform spacing or pitch "P1". In contrast, the features of the hard mask layer 16A that are positioned above the second region 12B do not exhibit such uniform spacing. More specifically, the features in the patterned mask layer above region 12B have a first pitch "P2" and a second pitch "P3" that are different from one another. Also note that the pitch P1 (for features above the first region 12A) is different from either of the regions P2 or P3. At the point of fabrication depicted in FIG. 1F, one or more etching processes may be performed through the patterned hard mask layer 16A so as to transfer features defined in the patterned hard mask layer 16A to the underlying layer of material 14. Accordingly, the features defined in the layer of material 14, e.g., gate structures, will ultimately exhibit the same pitch characteristics as are present in the patterned hard mask layer 16A. Note that, in the embodiment depicted in FIGS. 1A-1F, the CD2 Features (above the region 12B) have a larger critical dimension than do the CD1 Features (above the region 12A).

Figure 2A:
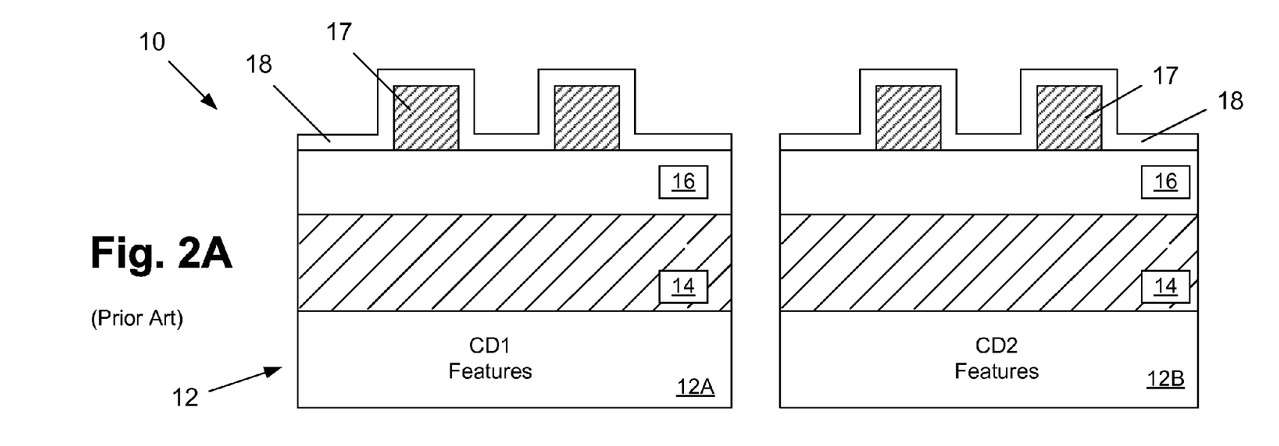
FIGS. 2A-2F depict another illustrative prior art technique of forming features having different widths using a subtractive sidewall image transfer technique.

FIGS. 2A-2F depict another illustrative prior art technique of forming features having different widths using a sidewall image transfer technique. This technique may generally be referred to as a "subtractive" sidewall image transfer technique. FIG. 2A depicts a prior art device 10 and regions 12A, 12B of the same semiconductor substrate 12 where features having a first critical dimension ("CD1 Features") will be formed above the region 12A while features having a second critical dimension ("CD2 Features"), that is different than the critical dimension of the CD1 Features, will be formed above the region 12B. The description of the material and components in FIGS. 1A-1F apply equally to FIGS. 2A-2F.

At the point of manufacture depicted in FIG. 2A, the layer of material 14 and the hard mask material 16 have been formed above the substrate 12. Also depicted in FIG. 2A are the mandrel structures 17 and the above-described layer of spacer material 18.

Figure 2B:
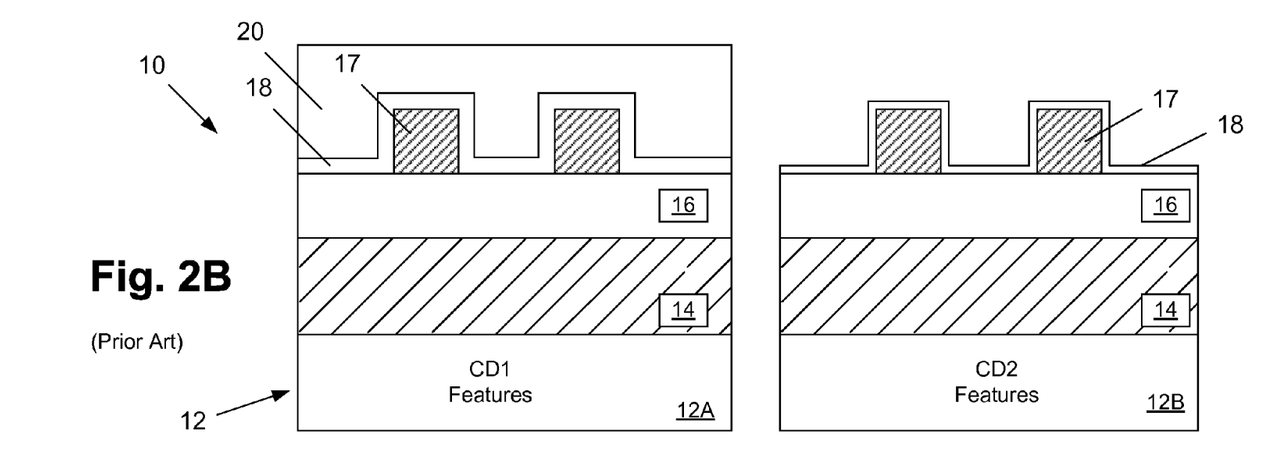

FIG. 2B depicts the device 10 after several process operations have been performed. First, the masking layer 20 was formed above the substrate 12 such that it covers the region 12A but leaves the region 12B exposed for further processing. Thereafter, a spacer-trimming etching process, e.g., an isotropic etching process, was performed on the layer of spacer material 18 positioned above the second region 12B so as to reduce the thickness of the layer of spacer material 18.

Figure 2C:
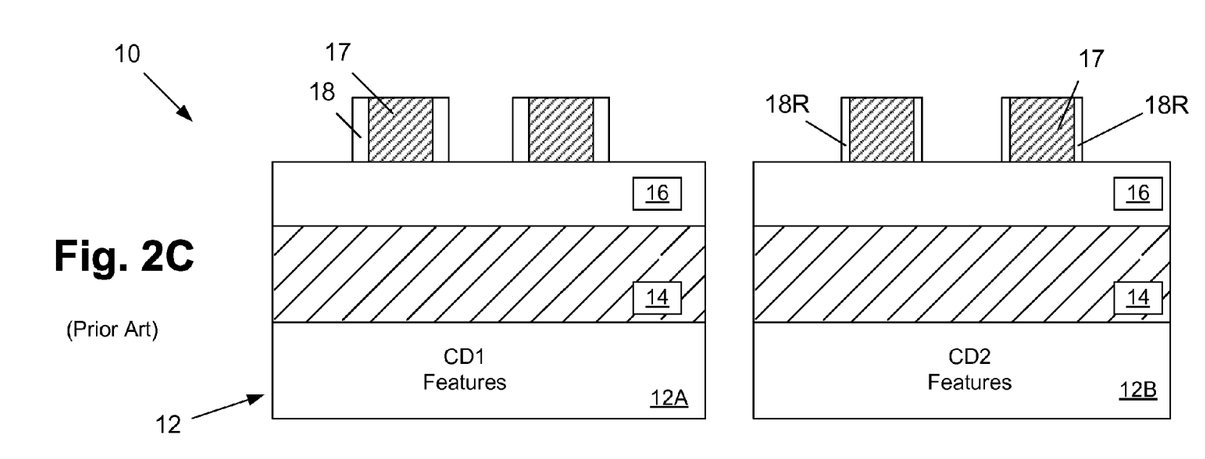

FIG. 2C depicts the device 10 after several process operations have been performed. First, the masking layer 20 was removed, thereby exposing both of the regions 12A, 12B for further processing. Second, an anisotropic etching process was performed to define spacers 18 adjacent the mandrels 17 above the first region 12A and the reduced-thickness spacers 18R adjacent the mandrels 17 above the second region 12B.

Figure 2D:
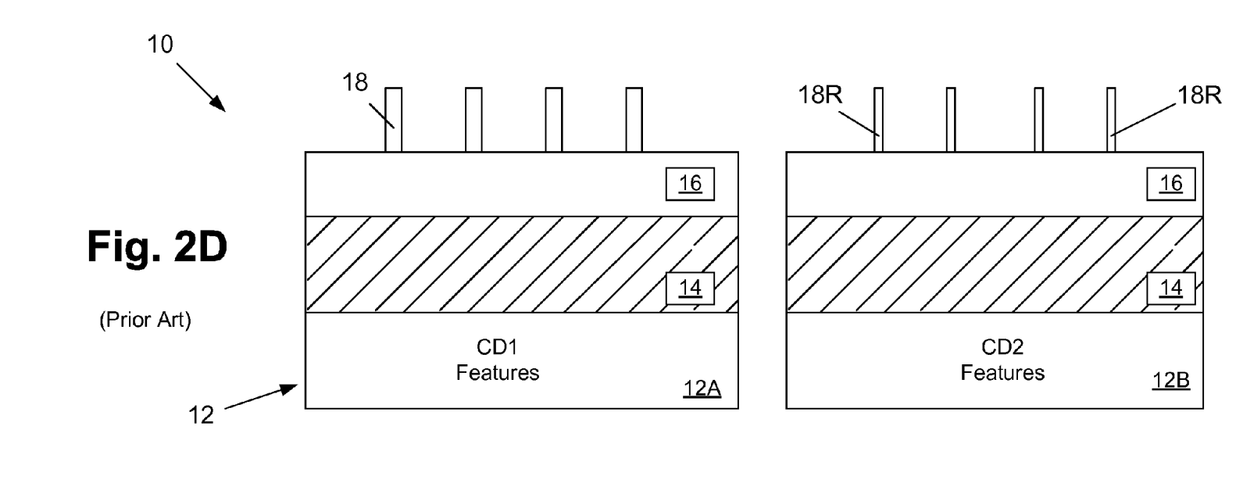

Then as shown in FIG. 2D, the mandrels 17 were removed by performing a selective etching process that leaves the spacers 18 and the reduced-thickness spacers 18R to act as masks in a subsequent etching process that defines features in the hard mask material 16, i.e., to create a patterned hard mask layer that will be used in defining various features in the layer of material 14.

Figure 2E:
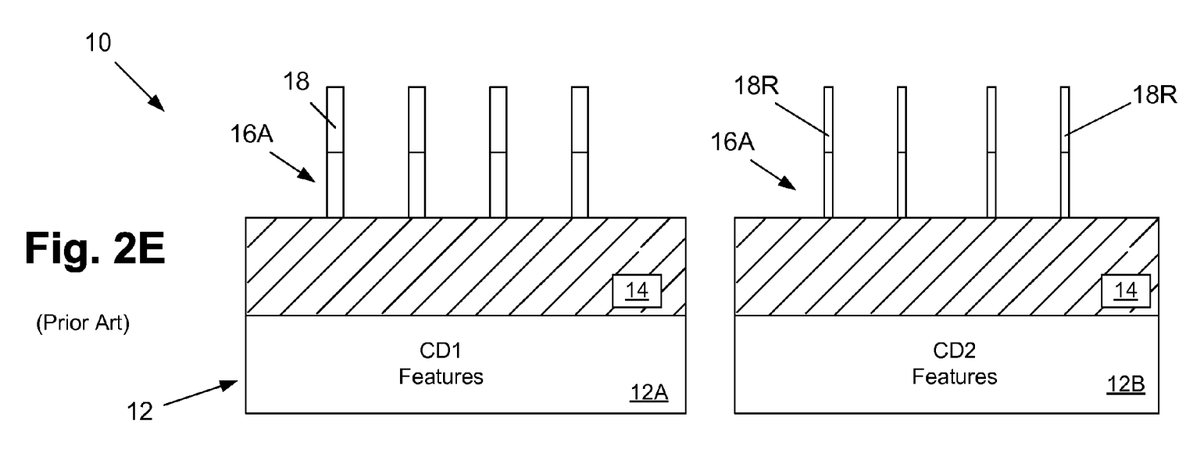

Next, as shown in FIG. 2E, an anisotropic etching process was performed on the hard mask material 16 through the mask layer comprised of the spacers 18 and reduced-thickness spacers 18R to thereby define a patterned hard mask layer 16A that will be used in defining various features in the layer of material 14.

Figure 2F:
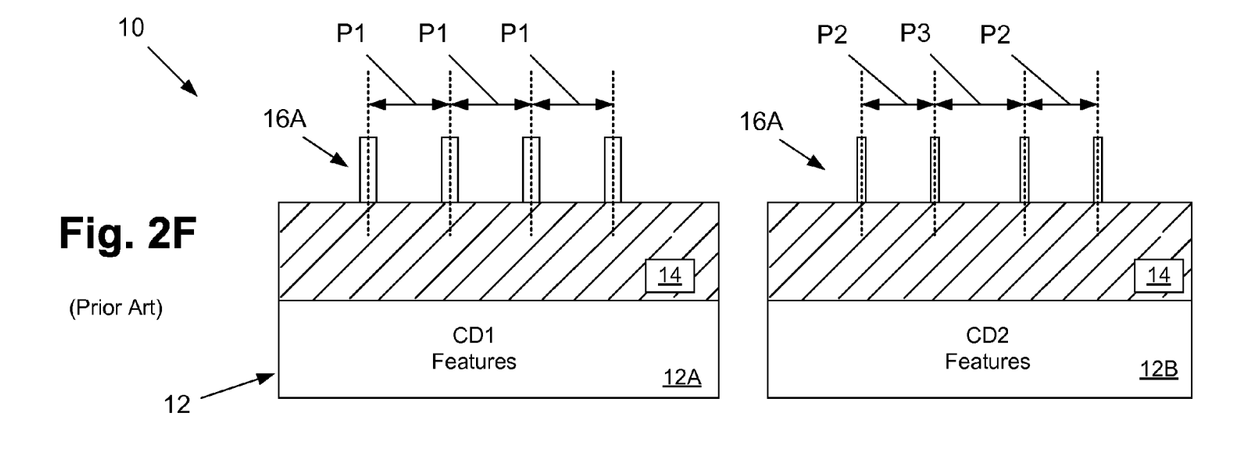

FIG. 2F depicts the device 10 after the spacers 18 and the reduced-thickness spacers 18R have been removed. Note that the features of the patterned hard mask layer 16A positioned above the first region 12A have a uniform spacing or pitch "P1". In contrast, the features of the hard mask layer 16A that are positioned above the second region 12B do not exhibit such uniform spacing. More specifically, the features in the patterned mask layer above region 12B have a first pitch "P2" and a second pitch "P3" that are different from one another. Also note that the pitch P1 (for features above the first region 12A) is different from either of the regions P2 or P3. At the point of fabrication depicted in FIG. 2F, one or more etching processes may be performed through the patterned hard mask layer 16A so as to transfer features defined in the patterned hard mask layer 16A to the underlying layer of material 14. Accordingly, the features defined in the layer of material 14, e.g., gate structures, will ultimately exhibit the same pitch characteristics as are present in the patterned hard mask layer 16A shown in FIG. 2F. Note that, in this embodiment, the CD2 Features (above the region 12B) have a smaller critical dimension than do the CD1 Features (above the region 12A).

As noted above, in manufacturing modern integrated circuit products, the critical dimensions of various structures that are formed when manufacturing integrated circuit products have decreased to the point where it is very difficult to form such features so that they exhibit uniform characteristics. In both of the examples described above, the fact that the features formed in the layer of material have different pitches makes the fabrication of such features even more difficult. That is, when patterning line-type features, for example, more uniform results are obtained when the pitch between such features is uniform. Forming such line-type features that have a non-uniform pitch pattern tends to result in variations in, for example, the width of the line features in areas where the pitch pattern changes. Such variations in the features, e.g., gate structures, can lead to decreases in device performance.

The present disclosure is directed to various methods of patterning features that have differing widths, wherein the features may be part of an integrated circuit device.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to various methods of patterning semiconductor device features that have differing widths. In one exemplary embodiment disclosed herein, a layer of material is formed above a semiconductor substrate, and a first sidewall image transfer process is performed so as to form a first plurality of spacers and a second plurality of spacers above the layer of material, wherein the first plurality of spacers are positioned above a first region of the semiconductor substrate and the second plurality of spacers are positioned above a second region of the semiconductor substrate, the first and second pluralities of spacers having a same initial width and a same pitch spacing. Additionally, a masking layer is formed above the layer of material, the masking layer covering the first plurality of spacers and exposing the second plurality of spacers, and a first etching process is performed through the masking layer on the exposed second plurality of spacers so as to form a plurality of reduced-width spacers having a width that is less than the initial width, wherein the first plurality of spacers and the plurality of reduced-width spacers define an etch mask.

In another illustrative example, a method is disclosed that includes forming a layer of hard mask material above a semiconductor substrate, forming a layer of spacer material above the layer of hard mask material, and forming, from the layer of spacer material, a first plurality of spacers and a second plurality of spacers above the layer of hard mask material, wherein the first plurality of spacers are positioned above a first region of the semiconductor substrate and the second plurality of spacers are positioned above a second region of the semiconductor substrate, and the first and second pluralities of spacers have a same initial width and a same pitch spacing. Additionally, the disclosed method further includes, among other things, forming a masking layer above the layer of hard mask material, the masking layer covering the first plurality of spacers and exposing the second plurality of spacers, and performing a first etching process through the masking layer on the exposed second plurality of spacers so as to form a plurality of reduced-width spacers having a width that is less than the initial width, wherein the first plurality of spacers and the plurality of reduced-width spacers define an etch mask. Furthermore, the method also includes using the etch mask to pattern the layer of hard mask material, the patterned layer of hard mask material including a first plurality of layer features positioned above the first region and a second plurality of layer features positioned above the second region, wherein the first and second pluralities of layer features have the same pitch spacing, each of the first plurality of layer features have a first width, and each of the second plurality of layer features have a second width that is less than the first width.

In yet another exemplary embodiment of the presently disclosed subject matter, a method includes forming a layer of hard mask material above first and second regions of a semiconductor substrate, and forming first and second mandrels above the layer of hard mask material, wherein the first mandrel is formed above the first region and the second mandrel is formed above the second region. The disclosed method further includes, among other things, forming a layer of spacer material above the first and second mandrels and above the layer of hard mask material, and forming a first plurality of spacers on sidewalls of the first mandrel and a second plurality of spacers on sidewalls of the second mandrel from the layer of spacer material, wherein the first and second pluralities of spacers have a same initial width and a same pitch spacing. The illustrative method also includes removing the first and second mandrels from above the layer of hard mask material selectively to the first and second pluralities of spacers, and, while covering the first plurality of spacers with a masking layer, a first etching process is performed on the second plurality of spacers so as to reduce the width of the second spacers to a width that is less than the initial width, wherein the first plurality of spacers having the initial width and the second plurality of spacers having the reduced width define an etch mask. Furthermore, at least one second etching process is performed through the etch mask to pattern the layer of hard mask material, the patterned layer of hard mask material including a first plurality of layer features positioned above the first region and a second plurality of layer features positioned above the second region, wherein the first and second pluralities of layer features have the same pitch spacing, each of the first plurality of layer features have a first width, and each of the second plurality of layer features have a second width that is less than the first width.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of patterning features that have differing widths. As will be readily apparent to those skilled in the art upon a complete reading of the present application, the present method is applicable to a variety of devices, including, but not limited to, ASICs, logic devices, memory devices, etc. Moreover, the present invention may be employed in forming any of a variety of different types of features formed on an integrated circuit product, such as lines, trenches, gate electrode structures, fins for FinFET devices, etc. Thus, the inventions disclosed herein should not be considered to be limited to any of the illustrative examples, devices or statements of use set forth herein. With reference to the attached drawings, various illustrative embodiments of the methods disclosed herein will now be described in more detail.

Figure 3A:
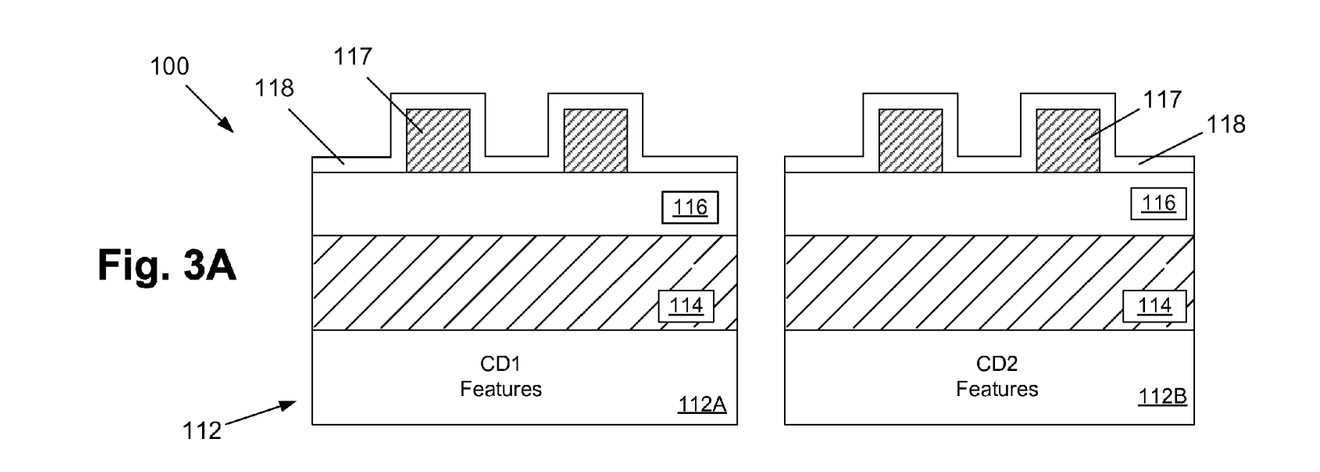
FIGS. 3A-3H depict one illustrative method disclosed herein for patterning features that have differing widths.

FIGS. 3A-3H depict one illustrative method disclosed herein for patterning features formed above a semiconductor substrate, wherein the features have differing widths. FIG. 3A depicts an integrated circuit product or device 100 and regions 112A, 112B of the same semiconductor substrate 112. As indicated, features having a first critical dimension ("CD1 Features") will be formed above the region 112A while features having a second critical dimension ("CD2 Features"), that is different than the critical dimension of the CD1 Features, will be formed above the region 112B. The substrate 112 may take the form of an active layer of a silicon-on-insulator (SOI) substrate or it may also be in bulk form. The substrate 112 may also be made of materials other than silicon. Thus, the terms "substrate" or "semiconductor substrate" as used herein and in the appended claims should be understood to cover all forms of any type of semiconductor material.

Initially, the process begins with performing a first sidewall image transfer process. At the point of manufacture depicted in FIG. 3A, a layer of material 114 to be patterned, e.g., a layer of gate electrode material, a conductive material for conductive lines, a layer of insulating material, etc., and a hard mask material 116 have been formed above the substrate 112. Also depicted in FIG. 3A are a plurality of so-called mandrel structures 117 and a layer of spacer material 118 that has been deposited across the substrate 112 by performing a conformal deposition process. In one illustrative example, the layer of material 114 may be a layer of polysilicon, the hard mask material 116 may be a layer of silicon nitride, the mandrels 117 may be comprised of a material that may be selectively etched relative to the hard mask material 116, such as an amorphous silicon material, and the layer of spacer material 118 may be a layer of material that may be selectively etched relative to the mandrels 117 and the hard mask material 116, e.g., silicon dioxide. The mandrels 117 may be formed by depositing a layer of mandrel material and thereafter patterning the layer of mandrel material using known photolithography tools and techniques. The width of the mandrels 117, the spacing between mandrels and the thickness of the layer of spacer material 118 may vary depending upon the particular application.

Figure 3B:
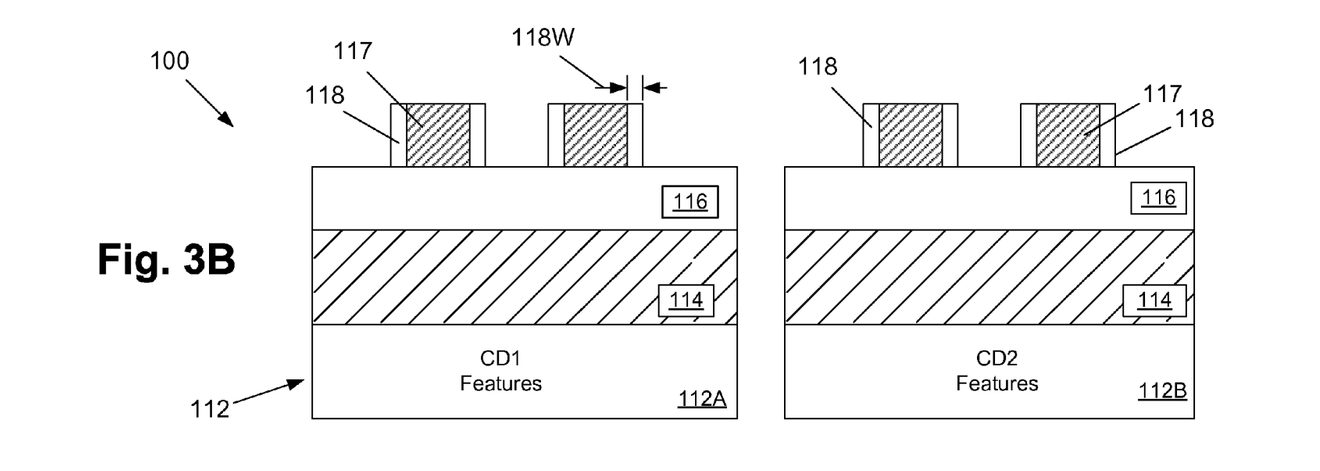

FIG. 3B depicts the device 100 after an anisotropic etching process was performed to define a plurality of spacers 118 adjacent the mandrels 117 above the first and second regions 12A, 12B. The spacers 118 have an initial width or critical dimension 118W.

Figure 3C:
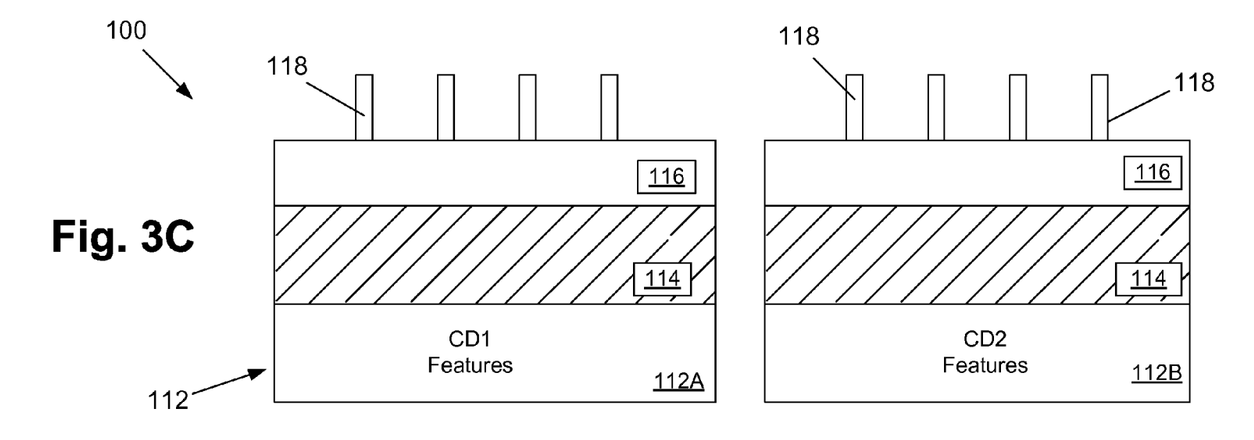

FIG. 3C depicts the device 100 after the mandrels 117 were removed by performing a selective etching process that leaves the spacers 118.

Figure 3D:
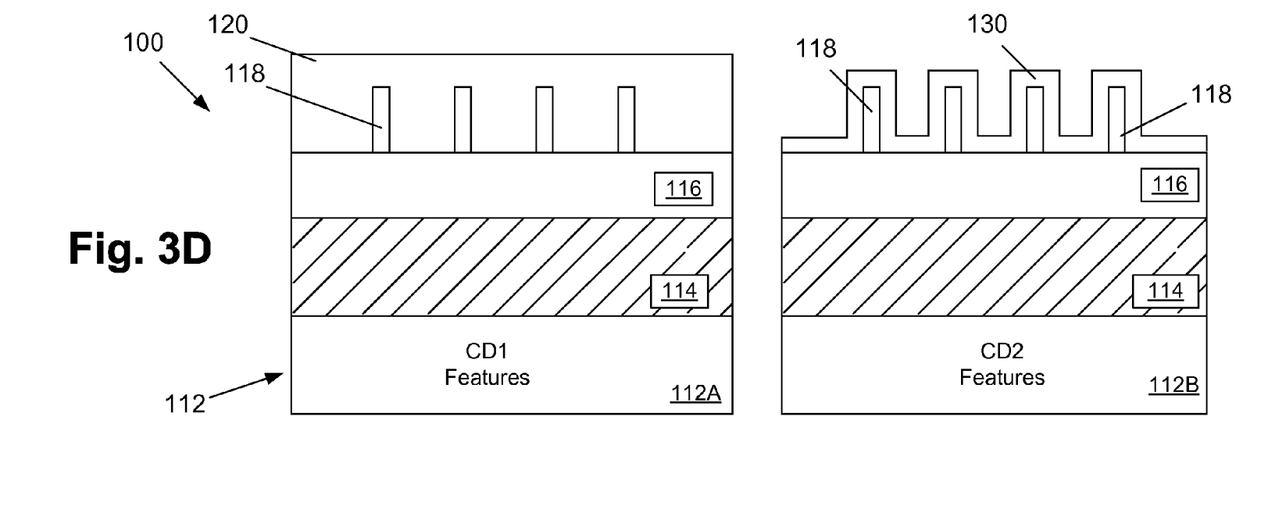

FIG. 3D depicts the device 100 after several process operations were performed. First, a masking layer 120, such as a patterned photoresist mask, was formed above the substrate 112 such that it covers the spacers 118 positioned above the region 112A but leaves the spacers 118 positioned above the region 112B exposed for further processing. Thereafter, a second layer of spacer material 130 was formed above the spacers 118 positioned above the second region 112B where the CD2 Features will be formed. The second layer of spacer material 130 was deposited by performing a conformal deposition process and it may be comprised of the same material as that of the first layer of spacer material 118. The thickness of the second layer of spacer material 130 may vary depending upon the particular application.

Figure 3E:
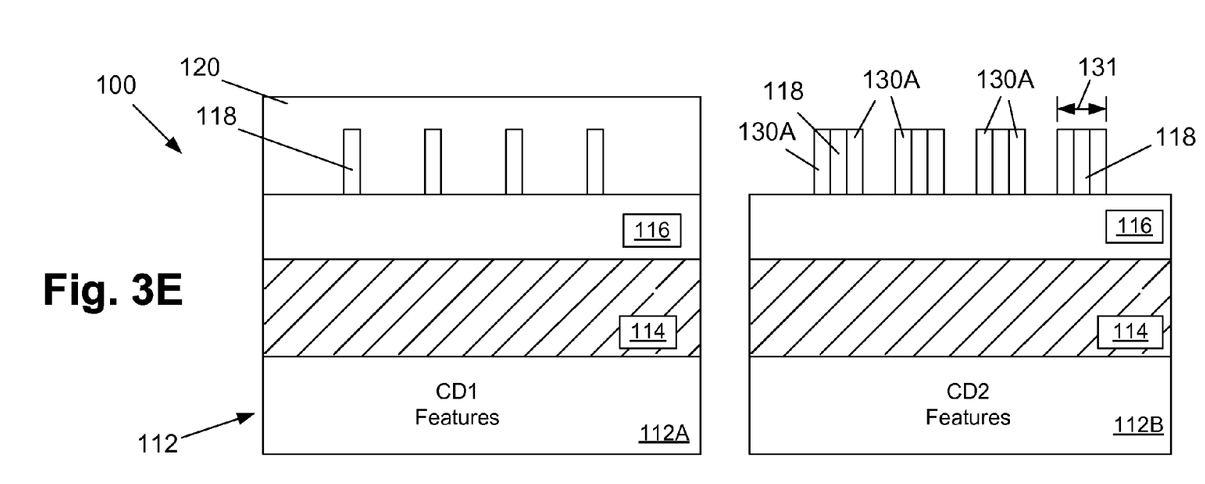

FIG. 3E depicts the device 100 after an anisotropic etching process was performed to define additional spacers 130A positioned adjacent the spacers 118 located above the second region 112B. In essence, the operation performed as depicted in FIGS. 3D-3E is a second sidewall image transfer process. The spacers 118 and the combined spacer structure 118/130A will be used as an etch mask layer in a subsequent etching process that defines features in the hard mask material 116, i.e., to create a patterned hard mask layer that will be used in defining various features in the layer of material 114. The combined spacer structure 118/130A has a width of critical dimension 131 that is greater than the initial width 118W (see FIG. 3B) of the spacers 118. The width 131 of the combined spacer structure 118/130A may vary depending upon the particular application.

Figure 3F:
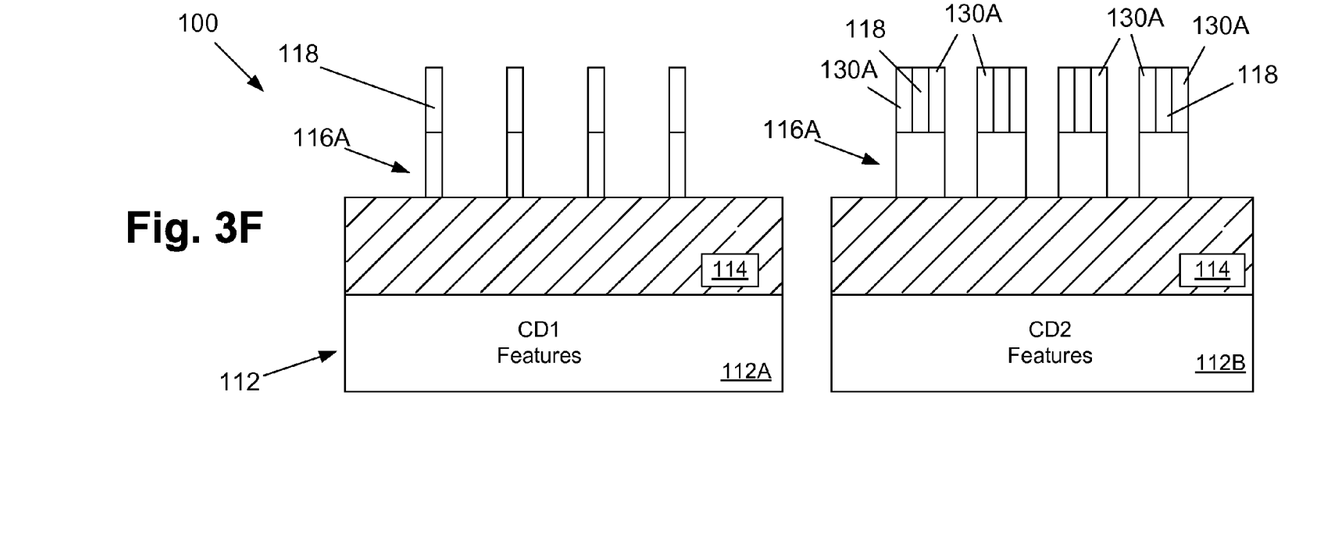

Next, as shown in FIG. 3F, an anisotropic etching process was performed on the hard mask material 116 through the mask layer comprised of the spacers 118 and the combination spacers 118/130A to thereby define a patterned hard mask layer 116A that will be used in defining various features in the layer of material 114.

Figure 3G:
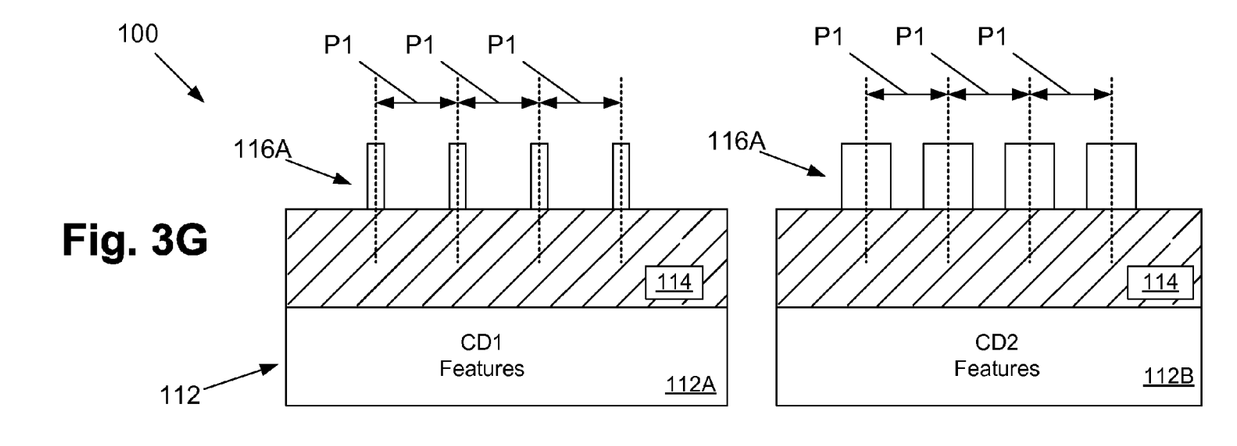

FIG. 3G depicts the device 100 after the spacers 118 and the combination spacers 118/130A have been removed. Note that, using the novel methods disclosed herein, the features of the patterned hard mask layer 116A positioned above the first region 112A and the second region 112B have a uniform spacing or pitch "P1". The magnitude of the pitch P1 (shown in FIG. 3G) using current day technology may be on the order of about 64 nm, depending upon the particular application. The features in the patterned hard mask layer 116A manufactured using the methods disclosed herein have a substantially uniform pitch in areas above both of the regions 112A, 112B, even though the features in the hard mask layer 116A have differing widths. This is in contrast to the prior art methods discussed in the background section of this application wherein the patterned hard mask layer 16A had features with differing widths and differing pitches.

Figure 3H:
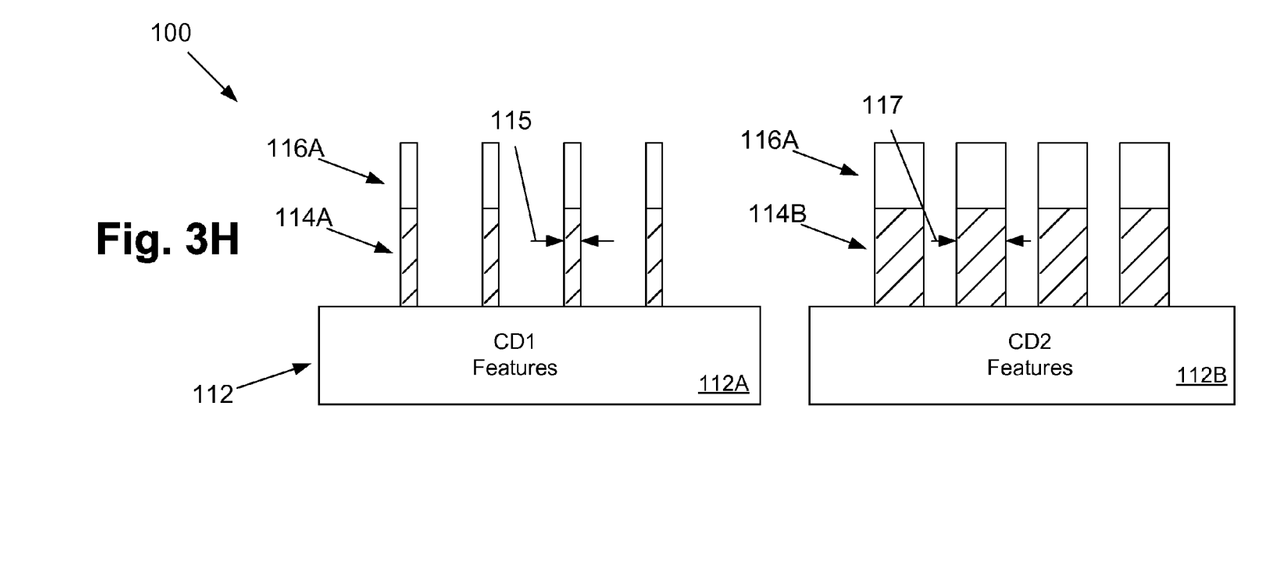

FIG. 3H depicts the device 100 after an anisotropic etching process has been performed on the layer of material 114 to define a plurality of layer features 114A positioned above the first region 112A and a plurality of layer features 114B positioned above the second region 112B. In this example, the critical dimension 115 of the layer features 114A is smaller than the critical dimension 117 of the layer features 114B. The absolute magnitude of the critical dimensions 115, 117 may vary depending upon the particular application and the type of layer features being formed. In the illustrative case where the layer features are gate structures, the dimension 115 may be about 20 nm, while the dimension 117 may be about 25 nm. Note that the drawings included herein are not to scale and the relative size of various features, layers and structures may be exaggerated to facilitate explanation.

Figure 4A:
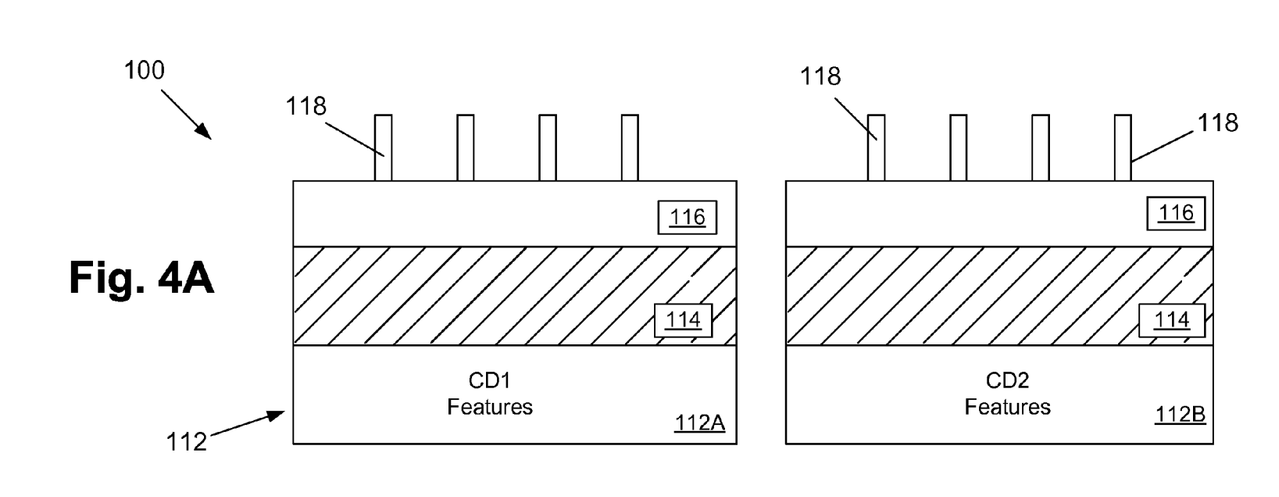
FIGS. 4A-4D depict another illustrative method disclosed herein for patterning features that have differing widths.

FIGS. 4A-4D depict another illustrative method disclosed herein for patterning features formed above a semiconductor substrate, wherein the features have differing widths. FIG. 4A depicts the device 100 at a point of fabrication that corresponds to that shown in FIG. 3C, i.e., after the spacers 118 have been formed and after the mandrels 117 have been removed. As before, features having a first critical dimension ("CD1 Features") will be formed above the region 112A while features having a second critical dimension ("CD2 Features"), that is different than the critical dimension of the CD1 Features, will be formed above the region 112B.

Figure 4B:
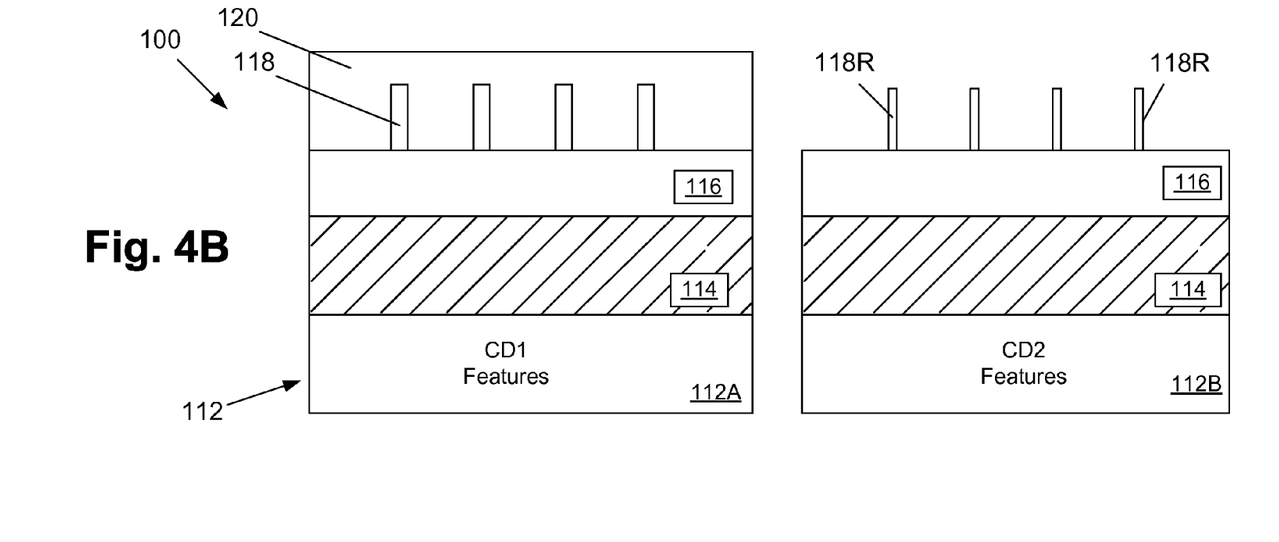

FIG. 4B depicts the device 100 after several process operations were performed. First, the above-described masking layer 120 was formed above the substrate 112 such that it covers the spacers 118 positioned above the region 112A but leaves the spacers 118 positioned above the region 112B exposed for further processing. Second, an isotropic etching process was performed to trim the spacers 118 above the region 112B to thereby result in the reduced-width spacers 118R above the second region 112B. The spacers 118 and the reduced-width spacers 118R will be used as an etch mask layer in a subsequent etching process that defines features in the hard mask material 116, i.e., to create a patterned hard mask layer that will be used in defining various features in the layer of material 114.

Figure 4C:
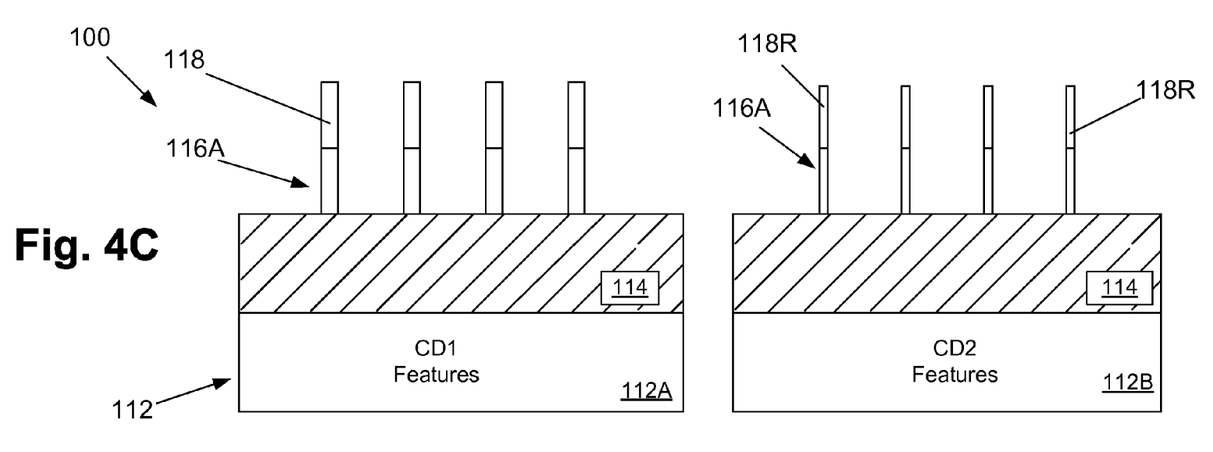

FIG. 4C depicts the device 100 after an anisotropic etching process was performed on the hard mask material 116 through the mask layer comprised of the spacers 118 and the reduced-width spacers 118R to thereby define a patterned hard mask layer 116A that will be used in defining various features in the layer of material 114.

Figure 4D:
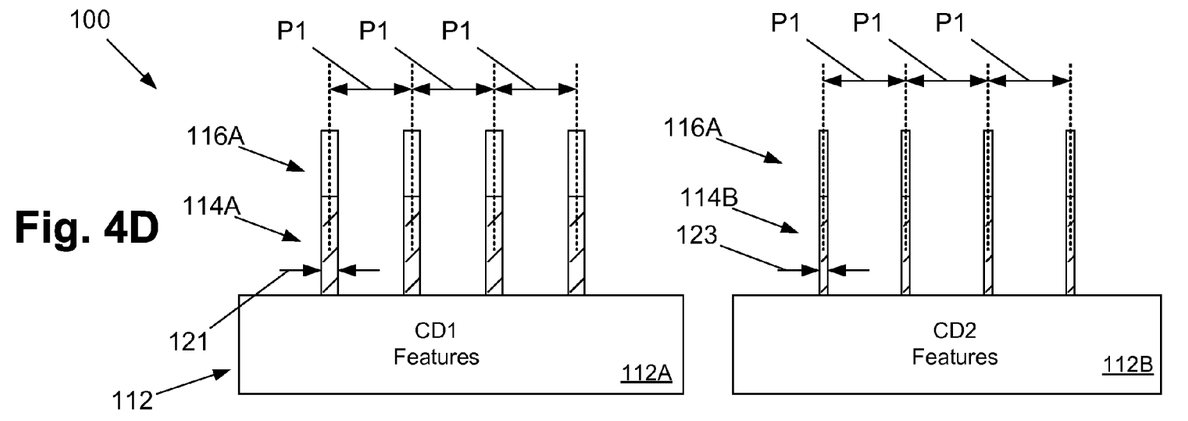

FIG. 4D depicts the device 100 after an anisotropic etching process has been performed on the layer of material 114 to define a plurality of layer features 114A positioned above the first region 112A and a plurality of layer features 114B positioned above the second region 112B. In this example, the critical dimension 121 of the layer features 114A is greater than the critical dimension 123 of the layer features 114B. As noted above, the absolute magnitude of the critical dimensions 121, 123 may vary depending upon the particular application and the type of features being formed. Again note that, using the novel methods disclosed herein, the features of the patterned hard mask layer 116A positioned above the first region 112A and the second region 112B have a uniform spacing or pitch spacing "P1", as do the resulting layer features 114A, 114B, even though the layer features 114A, 114B have differing critical dimension or widths. This is in contrast to the prior art methods discussed in the background section of this application wherein the patterned hard mask layer 16A had features with differing widths and differing pitches as did the ultimate layer features formed in the layer of material using the patterned hard mask layer 16A.

The particular embodiments disclosed above are illustrative only, as the invention may be modified and practiced in different but equivalent manners apparent to those skilled in the art having the benefit of the teachings herein. For example, the method steps set forth above may be performed in a different order. Furthermore, no limitations are intended by the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of material above a semiconductor substrate;
   performing a first sidewall image transfer process to form a first plurality of spacers and a second plurality of spacers above said layer of material, wherein said first plurality of spacers are positioned above a first region of said semiconductor substrate and said second plurality of spacers are positioned above a second region of said semiconductor substrate, said first and second pluralities of spacers having a same initial width and a same pitch spacing;
   forming a masking layer above said layer of material, said masking layer covering said first plurality of spacers and exposing said second plurality of spacers; and
   performing a first etching process through said masking layer on said exposed second plurality of spacers so as to form a plurality of reduced-width spacers having a width that is less than said initial width, wherein said first plurality of spacers and said plurality of reduced-width spacers define an etch mask.

2. The method of claim 1, wherein said layer of material is a layer of hard mask material.

3. The method of claim 1, wherein forming said layer of material above said semiconductor substrate comprises forming said layer of material above a layer of gate electrode material.

4. The method of claim 1, further comprising:
   removing said masking layer; and
   performing at least one second etching process on said layer of material through said etch mask.

5. The method of claim 4, wherein performing said at least one second etching process on said layer of material through said etch mask comprises forming a patterned layer of material, said patterned layer of material comprising a first plurality of layer features positioned above said first region of said semiconductor substrate and a second plurality of layer features positioned above said second region of said semiconductor substrate, wherein said first and second pluralities of layer features have said same pitch spacing and each of said first plurality of layer features has a different width than each of said second plurality of layer features.

6. The method of claim 5, further comprising:
   removing said etch mask; and
   performing a third etching process on an underlying layer of material through said patterned layer of material.

7. The method of claim 1, wherein performing said first sidewall image transfer process to form said first plurality of spacers and said second plurality of spacers above said layer of material comprises:
   forming a plurality of spaced-apart mandrel structures above said layer of material, wherein at least one of said mandrel structures is positioned above each of said first and second regions;
   depositing a layer of spacer material above said plurality of spaced-apart mandrel structures;

performing a second anisotropic etching process on said layer of spacer material to define said first plurality of spacers and said second plurality of spacers; and removing said plurality of spaced-apart mandrel structures.

8. A method, comprising:

forming a layer of hard mask material above a semiconductor substrate;

forming a layer of spacer material above said layer of hard mask material;

forming, from said layer of spacer material, a first plurality of spacers and a second plurality of spacers above said layer of hard mask material, wherein said first plurality of spacers are positioned above a first region of said semiconductor substrate and said second plurality of spacers are positioned above a second region of said semiconductor substrate, said first and second pluralities of spacers having a same initial width and a same pitch spacing;

forming a masking layer above said layer of hard mask material, said masking layer covering said first plurality of spacers and exposing said second plurality of spacers;

performing a first etching process through said masking layer on said exposed second plurality of spacers so as to form a plurality of reduced-width spacers having a width that is less than said initial width, wherein said first plurality of spacers and said plurality of reduced-width spacers define an etch mask; and using said etch mask to pattern said layer of hard mask material, said patterned layer of hard mask material comprising a first plurality of layer features positioned above said first region and a second plurality of layer features positioned above said second region, wherein said first and second pluralities of layer features have said same pitch spacing, each of said first plurality of layer features have a first width, and each of said second plurality of layer features have a second width that is less than said first width.

9. The method of claim 8, wherein using said etch mask to pattern said layer of hard mask material comprises performing at least one second etching process on said layer of hard mask material through said etch mask.

10. The method of claim 8, further comprising removing said masking layer prior to using said etch mask to pattern said layer of hard mask material.

11. The method of claim 8, wherein said layer of hard mask material is formed above a layer of material comprising said semiconductor substrate.

12. The method of claim 11, further comprising performing a third etching process on said layer of material through said patterned layer of hard mask material.

13. The method of claim 12, further comprising removing said etch mask prior to performing said third etching process.

14. A method, comprising:

forming a layer of hard mask material above first and second regions of a semiconductor substrate;

forming first and second mandrels above said layer of hard mask material, wherein said first mandrel is formed above said first region and said second mandrel is formed above said second region;

forming a layer of spacer material above said first and second mandrels and above said layer of hard mask material;

forming a first plurality of spacers on sidewalls of said first mandrel and a second plurality of spacers on sidewalls of said second mandrel from said layer of spacer material, said first and second pluralities of spacers having a same initial width and a same pitch spacing;

removing said first and second mandrels from above said layer of hard mask material selectively to said first and second pluralities of spacers;

while covering said first plurality of spacers with a masking layer, performing a first etching process on said second plurality of spacers so as to reduce said width of said second spacers to a width that is less than said initial width, wherein said first plurality of spacers having said initial width and said second plurality of spacers having said reduced width define an etch mask; and performing at least one second etching process through said etch mask to pattern said layer of hard mask material, said patterned layer of hard mask material comprising a first plurality of layer features positioned above said first region and a second plurality of layer features positioned above said second region, wherein said first and second pluralities of layer features have said same pitch spacing, each of said first plurality of layer features have a first width, and each of said second plurality of layer features have a second width that is less than said first width.

15. The method of claim 14, further comprising removing said masking layer prior to performing said at least one second etching process through said etch mask.

16. The method of claim 14, wherein said layer of hard mask material is formed above a layer of gate electrode material comprising said semiconductor substrate.

17. The method of claim 16, further comprising performing a third etching process on said layer of gate electrode material through said patterned layer of hard mask material.

18. The method of claim 17, further comprising removing said etch mask prior to performing said third etching process.

* * * * *